(12) United States Patent
Lin et al.

(10) Patent No.: US 11,676,876 B2
(45) Date of Patent: Jun. 13, 2023

(54) SEMICONDUCTOR DIE PACKAGE WITH WARPAGE MANAGEMENT AND PROCESS FOR FORMING SUCH

(71) Applicant: Intel Corporation, Santa Clara, CA (US)

(72) Inventors: Ziyin Lin, Chandler, AZ (US);
Elizabeth Nofen, Phoenix, AZ (US);
Vipul Mehta, Chandler, AZ (US);
Taylor Gaines, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 773 days.

(21) Appl. No.: 16/557,891

(22) Filed: Aug. 30, 2019

(65) Prior Publication Data

US 2021/0066152 A1    Mar. 4, 2021

(51) Int. Cl.
*H01L 23/31* (2006.01)
*H01L 21/56* (2006.01)
*H01L 23/367* (2006.01)
*H01L 23/373* (2006.01)
*H01L 21/67* (2006.01)

(52) U.S. Cl.
CPC ........ *H01L 23/3178* (2013.01); *H01L 21/565* (2013.01); *H01L 21/67288* (2013.01); *H01L 23/367* (2013.01); *H01L 23/373* (2013.01)

(58) Field of Classification Search
CPC ............... H01L 23/3178; H01L 21/565; H01L 21/67288; H01L 23/367; H01L 23/373; H01L 24/29; H01L 24/33; H01L 24/94; H01L 24/95; H01L 24/96; H01L 24/97; H01L 24/16; H01L 24/27; H01L 24/81; H01L 24/83; H01L 2224/16145; H01L 2224/16227; H01L 2224/2731; H01L 2224/2732; H01L 2224/27334; H01L 2224/2742; H01L 2224/2919; H01L 2224/2929; H01L 2224/29386; H01L 2224/32013; H01L 2224/32058; H01L 2224/321; H01L 2224/32105; H01L 2224/32106; H01L 2224/32145; H01L 2224/32245; H01L 2224/33181; H01L 2224/33183; H01L 2224/73204; H01L 2224/83856; H01L 2224/95001; H01L 23/04; H01L 24/32; H01L 25/0655; H01L 25/18; H01L 25/50; H01L 21/561; H01L 21/568; H01L 23/562; H01L 23/42; H01L 2224/33505; H01L 2224/83005; H01L 2224/94; H01L 2224/95; H01L 2224/96; H01L 2924/16152; H01L 2924/181
See application file for complete search history.

(56) References Cited

U.S. PATENT DOCUMENTS

2014/0084456 A1*    3/2014    Kang ..................... H01L 25/50
                                                    257/737

* cited by examiner

*Primary Examiner* — Kyoung Lee
(74) *Attorney, Agent, or Firm* — Schwabe, Williamson & Wyatt, P.C.

(57) ABSTRACT

A device is disclosed. The device includes a first die, a plurality of chiplets above the first die, a first underfill material beneath the chiplets, and a gap fill material between the chiplets. The gap fill material is different from the first underfill material. An interface region is formed between the first underfill material and the gap fill material.

26 Claims, 9 Drawing Sheets

SEMICONDUCTOR DIE PACKAGE WITH WARPAGE MANAGEMENT AND PROCESS FOR FORMING SUCH

TECHNICAL FIELD

Embodiments of the disclosure pertain to semiconductor die packages and, in particular, to semiconductor die packages with warpage management.

BACKGROUND

High post-capillary underfill (CUF) wafer warpage leads to significant package assembly challenges in wafer level packages. After singulation, the high composite die warpage impacts chip attach yield. Previous solutions that have been used to address composite die warpage include CUF material reformulation and wafer flattening.

A disadvantage of CUF material reformulation is that in order to maintain processability and reliability performance, CUF material properties are only fine-tuned within a narrow range, which limits its impact to warpage reduction to <20%. Moreover, a disadvantage of wafer flattening is that it is a temporary effect, and must be done frequently during wafer level assembly. In addition, it does not address singulated die warpage issues.

DESCRIPTION OF THE EMBODIMENTS

Semiconductor die packages with warpage management are described. It should be appreciated that although embodiments are described herein with reference to example semiconductor die packages with warpage management implementations, the disclosure is more generally applicable to semiconductor die packages with warpage management implementations as well as other type of semiconductor die packages with warpage management implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

High post-capillary underfill (CUF) wafer warpage leads to significant package assembly challenges in wafer level packages. After singulation, the high composite die warpage impacts chip attach yield. Previous solutions that have been used to address composite die warpage include CUF material reformulation and wafer flattening.

A disadvantage of CUF material reformulation is that in order to maintain processability and reliability performance, CUF material properties are only fine-tuned within a narrow range, which limits its impact to warpage reduction to <20%. Moreover, a disadvantage of wafer flattening is that it is a temporary effect, and must be done frequently during wafer level assembly. In addition, it does not address singulated die warpage issues.

An approach that addresses the shortcomings of previous approaches is disclosed herein. As part of the approach, in an embodiment, a two-step encapsulation process at the wafer level is provided, in which capillary underfill (CUF) or non-conductive film (NCF) is used to fill the C4 area for bump reliability, and a gap fill material is used to fill the die-to-die space to manage the wafer warpage and die warpage after singulation.

In an embodiment, low wafer warpage is enabled by the encapsulant material which increases down-stream wafer process yield. In an embodiment, a permanent low wafer warpage effect is provided such that frequent correction isn't required. In an embodiment, because the singulated die exhibits low warpage, chip attach yield on the substrate is increased.

In an embodiment, the encapsulant used in the C4 area (CUF or NCF) can be different from the encapsulant in-between the dies. In an embodiment, the gap fill can have a low modulus and a low glass transition temperature (Tg), which is usually not observed in CUF and mold materials. In an embodiment, visual inspection and/or reverse engineering techniques can be used to identify features of a semiconductor package. In an embodiment, visual inspection can include but is not limited to delidding, forming a cross-section, and/or using scanning electron microscope (SEM) to check the chemical composition or filler of encapsulant in the C4 area and in between dies.

Figure 1:
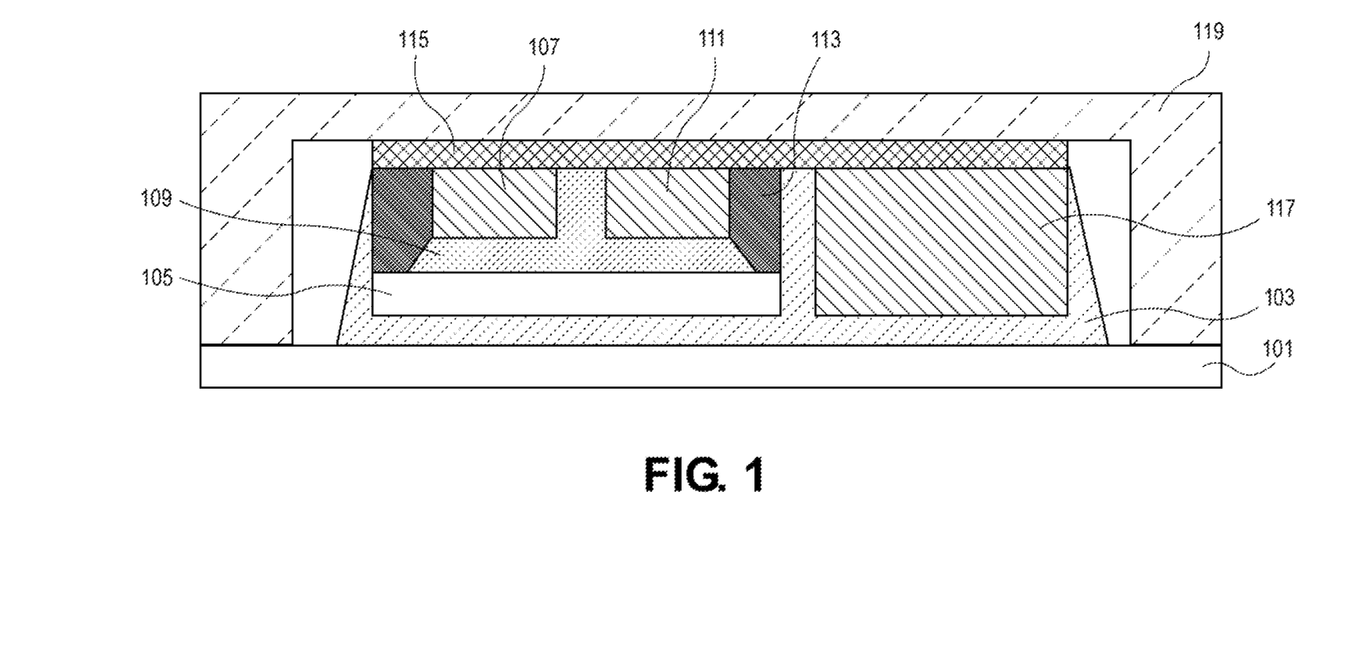
FIG. 1 illustrates a semiconductor die package according to a previous approach.

FIG. 1 illustrates a semiconductor die package 100 according to a previous approach. In the FIG. 1 embodiment, the semiconductor die package 100 includes substrate 101, package CUF 103, base die 105, chiplet 107, underfill/non-conductive film (UF/NCF) 109, chiplet 111, mold 113, thermal interface material (TIM) 115, companion die 117 and heat spreader 119.

Referring to FIG. 1, in an embodiment the package CUF 103 can be formed on the substrate 101. In an embodiment, the base die 105 can be formed on the package CUF 103. In an embodiment, the companion die 117 can be formed on the package CUF 103. In an embodiment, the UF/NCF 109 can be formed between the base die 105 and the chiplets 107 and 111. In an embodiment, the chiplet 107 can be formed on the UF/NCF 109. In an embodiment, the chiplet 111 can be formed on the UF/NCF 109. In addition, in an embodiment, a portion of the UF/NCF 109 can be formed between the chiplet 107 and the chiplet 111. In an embodiment, the mold 113 can be formed above peripheral portions of the base die 105 and on the sides of the UF/NCF 109, the chiplet 107 and the chiplet 111. In an embodiment, the thermal interface material (TIM) 115 can be formed above the mold 113, the chiplet 107, the chiplet 111, a portion of the UF/NCF 109, a portion of the package CUF 103, and the companion die 117. The heat spreader 119 can be attached to the periphery of the substrate 101 and can extend above the TIM 115.

As regards semiconductor die package 100, high post-CUF wafer warpage, e.g., that can result from CTE differences between semiconductor and underfill materials, can lead to significant package assembly challenges. High warpage impacts chip attach yield as described herein. Previous solutions that have been used to address high warpage include CUF material reformulation and wafer flattening. However, the impact to warpage reduction of these measures is very limited. Moreover, wafer flattening only provides a temporary effect, and must be repeated frequently during wafer level assembly.

Figure 2A:
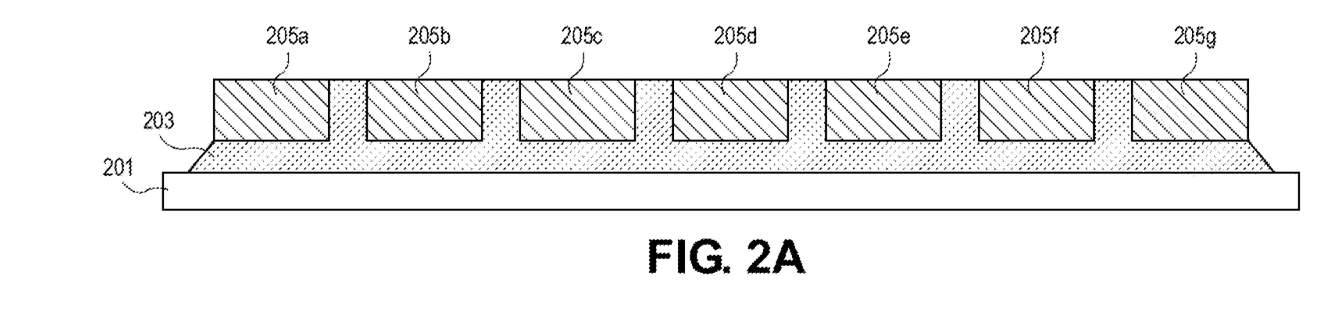
FIGS. 2A-2C illustrate a process flow for forming the package of FIG. 1.
Figure 2B:
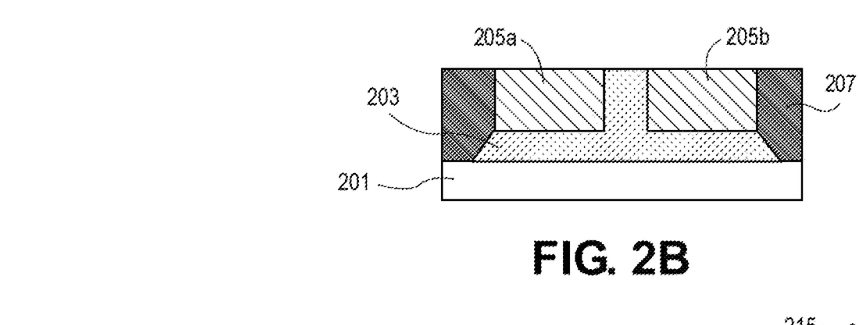
Figure 2C:
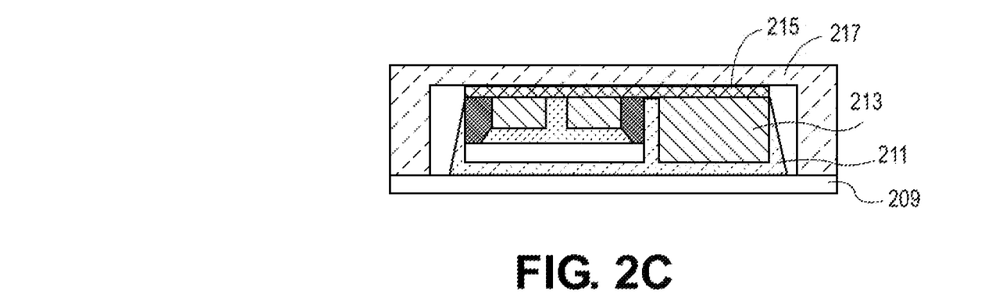

FIGS. 2A-2C illustrate a process flow for forming the package of FIG. 1. Referring to FIG. 2A, the initial structure includes base die 201, UF/NCF 203, and chiplets 205a-205g.

Referring to FIG. 2B, subsequent to one or more operations that result in the structure shown in FIG. 2A, the wafer is singulated into individual structures. In FIG. 2B, an individual structure is shown that includes chiplets 205a and 205b. In an embodiment, molding 207 is formed on the singulated structure adjacent the sides of the chiplet 205a, the chiplet 205b and the UF/NCF 203, and above peripheral regions of the base die 201.

Referring to FIG. 2C, subsequent to one or more operations that result in the structure shown in FIG. 2B, the singulated structure is attached to a substrate 209 with package CUF 211. Moreover, a heat spreader 217 is attached to the substrate 209. In an embodiment, the heat spreader 217 is attached to the periphery of the substrate 209 and covers TIM 215 that is formed above the singulated structure and a companion die 213.

As regards the wafer level assembly described with reference to FIGS. 2A-2C, initially the chiplets 205a-205g are attached to the large base die 201, and thereafter underfilling processes are performed where UF/NCF 203 fills the C4 area and the area between chiplets 205a-205g. It should be appreciated that the CTE mismatch between silicon and the UF/NCF 203 causes high warpage after underfill curing processes. The high warpage impacts the assembly yield of down-stream processes such as molding and grinding, etc. Additionally, after wafer singulation into individual composite die as shown at FIG. 2B, the die exhibits higher warpage, which significantly increases chip attach risks. As regards package reliability, reliability testing based on user conditions indicate that for the semiconductor die package that is shown in FIG. 1 (and formed by the process of FIGS. 2A-2C), capillary underfill delamination and cracking at the tight die-to-die spaces between chiplets is a significant failure mode concern.

Figure 3:
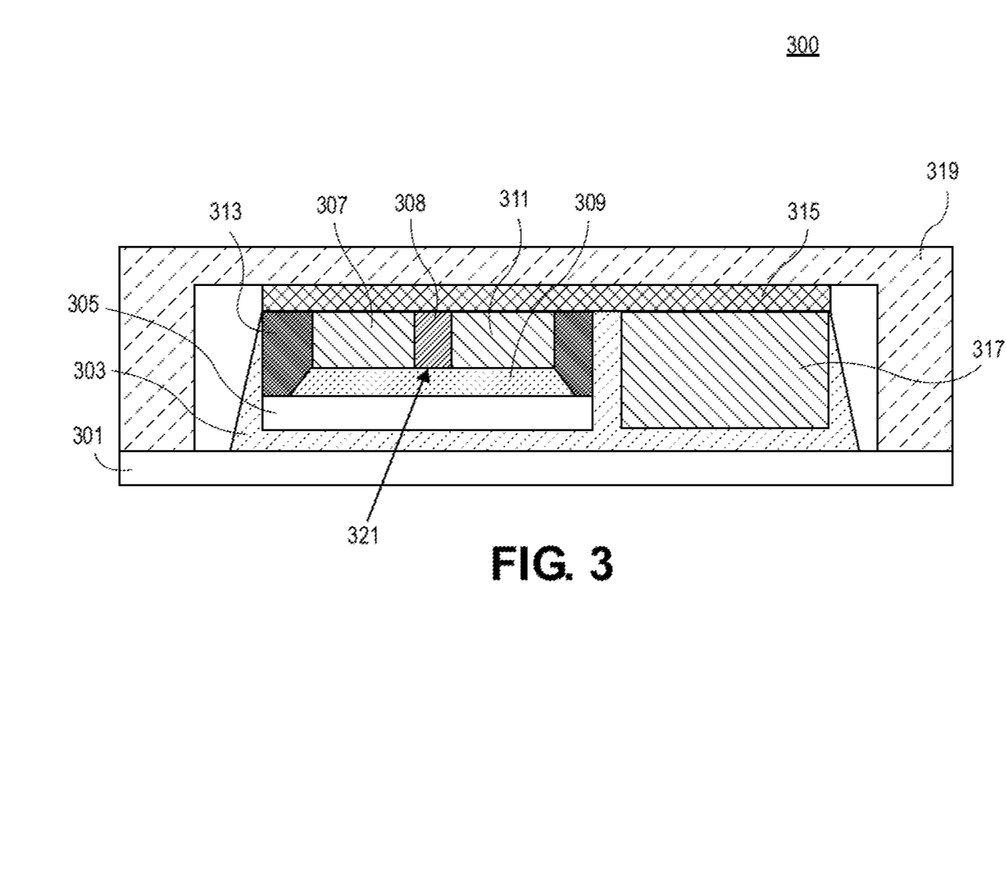
FIG. 3 illustrates a semiconductor die package with different underfill and gap fill materials according to an embodiment.

FIG. 3 illustrates a semiconductor die package 300 according to an embodiment. In an embodiment, as shown in FIG. 3, the semiconductor die package 300 can include substrate 301, package CUF 303, base die 305, chiplet 307, gap fill 308, UF/NCF 309, chiplet 311, mold 313, TIM 315, companion die 317, heat spreader 319 and gap fill/UF interface 321.

Referring to FIG. 3, in an embodiment, the package CUF 303 can be formed on the substrate 301. In an embodiment, the CUF 303 can have a Tg greater than 100 degrees Celsius. In other embodiments, the CUF 303 can have a Tg of other values. In an embodiment, the CUF 303 can have a CTE less than 30 ppm/K. In an embodiment, the CUF 303 can have another CTE. In an embodiment, the base die 305 can be formed on the package CUF 303. In an embodiment, the chiplet 307 can be formed on the UF/NCF 309. In an embodiment, the gap fill 308 can be formed between the chiplet 307 and the chiplet 311. In an embodiment, the gap fill 308 can have a Tg that is approximately room temperature, a low modulus of less than 6 Gpa, and be highly adhesive. In other embodiments, the gap fill 308 can have another Tg and another modulus. In an embodiment, the UF/NCF 309 can be formed between the base die 305 and the chiplets 307 and 311 and gap fill 308. In an embodiment, the UF/NCF 309 can have a Tg greater than 100 degrees Celsius. In other embodiments, the UF/NCF 309 can have another Tg. In an embodiment, the UF/NCF 309 can have a CTE less than 30 ppm/K. In other embodiments, the UF/NCF 309 can have another CTE. In an embodiment, the chiplet 311 can be formed on the UF/NCF 309. In an embodiment, the mold 313 can be formed above peripheral portions of the base die 305 and on the sides of the UF/NCF 309, the chiplet 307 and the chiplet 311. In an embodiment, the TIM 315 can be formed above the mold 313, the chiplet 307, the gap fill 308, the chiplet 311, the package CUF 303 (the part between the mold 313 and the companion die 317), and the companion die 317. In an embodiment, the heat spreader 319 can be attached to the periphery of the substrate 301 and can extend above the TIM 315. In an embodiment, the companion die 317 can be formed on the package CUF 303. In an embodiment, the gap fill/UF interface region 321 can be formed at the interface of the gap fill 308 and the UF/NCF 309. In an embodiment, the gap fill/UF interface region 321 is detectable through visual inspection and other techniques.

In an embodiment, substrate 301 can be formed from epoxy, polyimide, Ajinomoto Buildup Film (ABF) film, or synthetic fibers. In other embodiments, the substrate 301 can be formed from other materials. In an embodiment, the package CUF 303 can be formed from thermoset epoxies that are constituted of silicon oxide particles. In other embodiments, the package CUF 303 can be formed from other materials. In an embodiment, the base die 305 can be formed from silicon. In other embodiments, the base die 305 can be formed from other materials. In an embodiment, the chiplet 307 can be formed from silicon. In other embodiments, the chiplet 307 can be formed from other materials. In an embodiment, the gap fill 308 can be formed from a flexible epoxy or a polyurethane. In an embodiment, the epoxy materials used for the gap fill 308 can include the materials used to form the underfill/NCF 309, and additional flexible epoxy, flexible hardener, or other additions to reduce the glass transition temperate Tg. In an embodiment, polyurethane materials that can be used for the gap fill 308 adhesive can take the form of a dispensable paste. In an embodiment, the viscosity and thixotropic index can be balanced per requirements of the gap and dispense process, e.g., 40,000 centipoise with a thixotropic index of 4.8. In other embodiments, other viscosity and thixotropic index balances can be used. In an embodiment, the thixotropic index can be controlled with the addition of fumed silica (up to 20%) and can be adjusted if desired for rheology. In an embodiment, lower modulus versions can be utilized and can include non-aromatic types with long, flexible aliphatic linkages instead of conventional aromatic diisocyanates. In an embodiment, the polymerization components can be tuned to provide the appropriate modulus and glass transition temperature Tg. In an embodiment, other additives can include but are not limited to: adhesion promotors (silanes, titanates, zirconates), initiators/catalysts, fillers for fracture toughness (silicone, rubber, etc.), etc. In other embodiments, the gap fill 308 can be formed from other materials.

In an embodiment, the UF/NCF 309 can be formed from an epoxy based material. In an embodiment, the UF/NCF 309 can have a plurality of initial forms including, but not limited to, film, liquid, or powder. In an embodiment, the UF/NCF 309 may be pre B-stage or B-stage. In an embodiment, the UF/NCF 309 can be applied by a plurality of methods including printing, curtain coating, molding, or lamination. In other embodiments, the UF/NCF 309 can be applied by other methods. In an embodiment, the epoxy material can include a mixture of epoxy resins. In an embodiment, the epoxy material may be homopolymerized or may contain one or more hardeners. In an embodiment, hardeners can include but are not limited to amines, phenols, anhydrides, or the like and their mixtures. In an embodiment, other materials that can be used include but are not limited to acrylates, bismaleimides, polyesters, polyimides, polyolefins, polystyrene, polyurethanes, or the like and their mixtures. In an embodiment, the UF/NCF 309 can include filler materials for mechanical property enhancement. In an embodiment, the filler material can include but are not limited to silica, alumina, boron nitride, zinc oxide or the like and their mixtures. In an embodiment, the filler materials can include a plurality of particle sizes. The UF/NCF 309 can include additives that include but are not limited to colorants, catalysts, inhibitors, ion trappers, stress absorbers, polymers, surfactants, binding agents, or fluxing agents. In other embodiments, the UF/NFC 309 can be formed from other materials.

In an embodiment, the chiplet 311 can be formed from silicon. In other embodiments, the chiplet 311 can be formed from other materials. In an embodiment, the mold 313 can be formed from an epoxy resin. In other embodiments, the mold 313 can be formed from other materials. In an embodiment, the TIM 315 can be formed from a thermal grease or a phase change material. In other embodiments, the TIM 315 can be formed from other materials. In an embodiment, the companion die 317 can be formed from silicon. In other embodiments, the companion die 317 can be formed from other materials. In an embodiment, the heat spreader 319 can be formed from aluminum, copper, diamond, beryllium, AlSiC or a copper-tungsten alloy. In other embodiments, the heat spreader 319 can be formed from other materials.

During fabrication, in an embodiment, low wafer warpage is enabled by the encapsulant materials used to form the gap fill 308, and UF/NCF 309. The low wafer warpage increases down-stream wafer process yield. In an embodiment, the effect provided by the encapsulant materials is permanent such that frequent correction is not required. In addition, because the singulated die exhibits low warpage, chip attach yield on the substrate is increased.

Figure 4A:
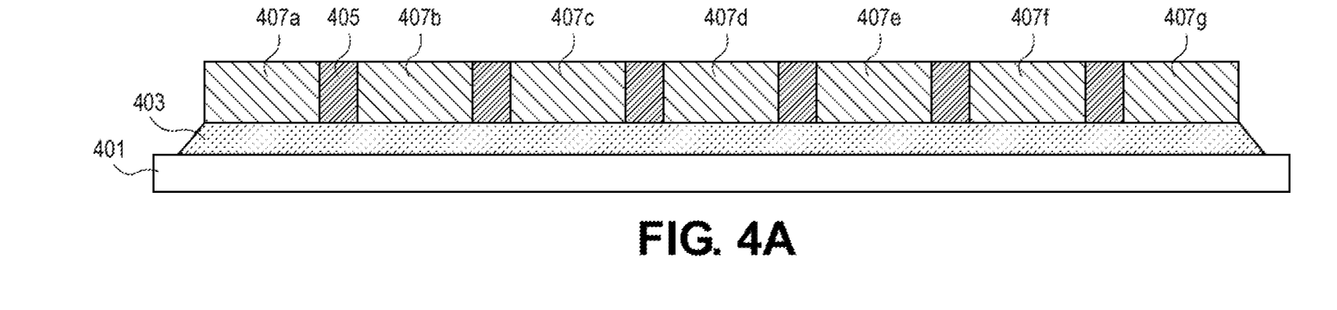
FIGS. 4A-4C illustrate a process flow for forming the package of FIG. 3.
Figure 4B:
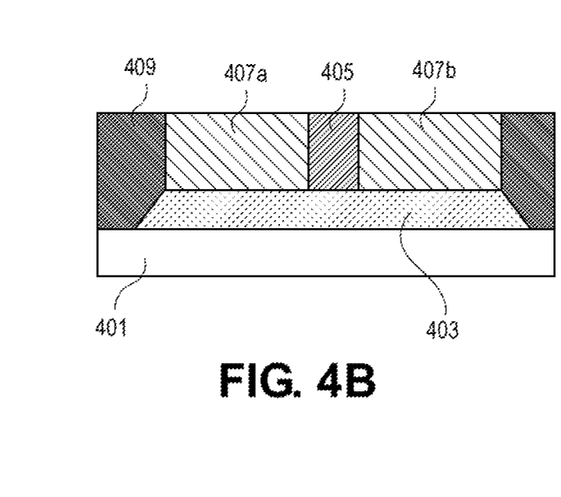
Figure 4C:
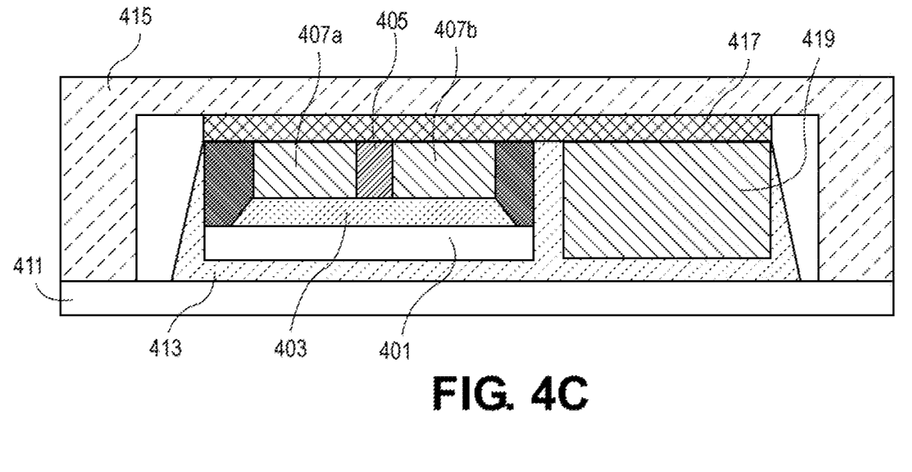

FIGS. 4A-4C illustrate a process flow for forming the package of FIG. 3. Referring to FIG. 4A, the initial structure includes base die 401, UF/NCF 403, gap fill 405, and chiplets 407a-407g. The components of the package shown in FIG. 4A that are similar to components of the package shown in FIG. 3 can be arranged similarly and can be formed from similar materials as those shown in FIG. 3. As such, a description of the arrangement and material makeup of such components is not repeated here for purposes of clarity and brevity.

Referring to FIG. 4B, subsequent to one or more operations that result in the structure shown in FIG. 4A, the wafer is singulated into individual structures. In addition, molding 409 is formed on a singulated structure adjacent the sides of the chiplets 407a and 407b and the UF/NCF 403 and above the base die 401. In an embodiment, the wafer can be singulated by sawing or dicing. In other embodiments, the wafer can be singulated in other manners.

Referring to FIG. 4C, subsequent to one or more operations that result in the structure shown in FIG. 4B, the singulated structure and a companion die 419 are attached to a substrate 411 with package CUF 413. Moreover, a heat spreader 415 is attached to the substrate 411. In an embodiment, the heat spreader 415 is attached to the periphery of the substrate 411 and covers TIF 417 that is formed above the singulated structure and the companion die 419.

In an embodiment, the gap fill 405 material is designed to fill narrow spaces between the chiplets 407a and 407b. FIGS. 4A-4C illustrate the manner in which the narrow spaces are filled during the package formation process to provide benefits derived from the use of material that has properties that are tailor-made to achieve the benefits. For example, in an embodiment, at the wafer level and in singulated composite die, the gap fill 405 is designed to manage the wafer warpage and composite die warpage to improve the assembly yield. Moreover, on a finished package, the gap fill 405 is designed to improve package reliability. In an embodiment, in order to meet these objectives, the gap fill 405 can include but is not limited to having the following characteristics: low glass transition temperature Tg (<80 C) to minimize the residual stress for low warpage, low elasticity modulus (<6 Gpa), and high percent elongation (>6%) for high package reliability. As used herein, percent elongation is intended to refer to the amount that a material can deform up to rupture or fracture. It should be appreciated that these properties are different from typical CUF or NCF materials which can have a high Tg (>80 C), high elasticity modulus (>6 Gpa) and lower percent elongation (<6%). In an embodiment, the resin chemistry of the gap fill 405 can include but is not limited to flexible epoxy, polyurethane, or silicone.

Figure 5A:
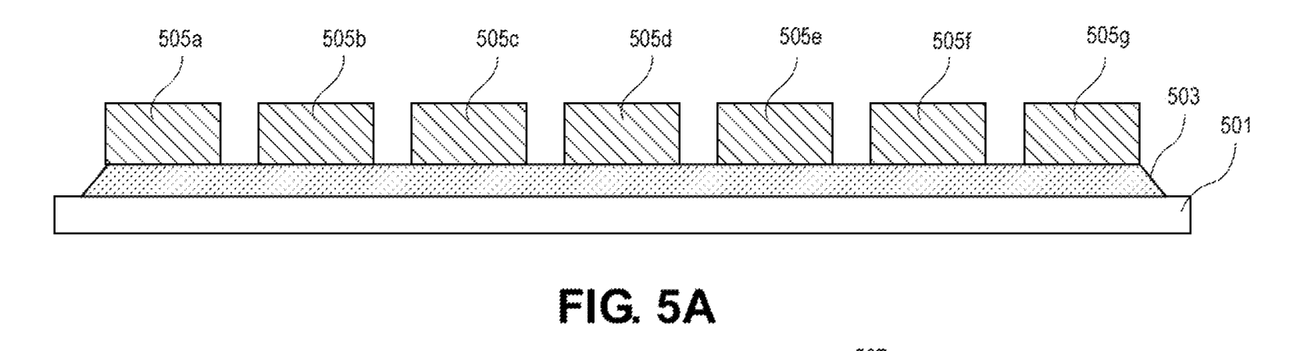
FIGS. 5A and 5B illustrate a process for forming a semiconductor die package with different underfill and gap fill materials according to an embodiment.
Figure 5B:
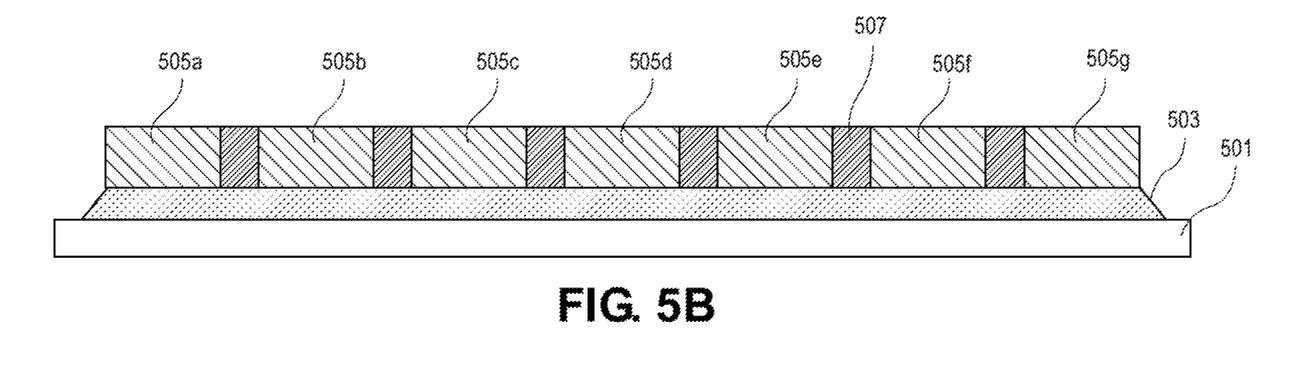

FIGS. 5A and 5B illustrate a gap fill assembly process according to an embodiment. Referring to FIG. 5A, the initial structure includes base die 501, NCF 503 and chiplets 505a-505g. In this embodiment, the NCF 503 is formed on the base die 501 and the chiplets 505a-505g are formed on the NCF 503 before gap fill material is formed between the chiplets 505a-505g. In an embodiment, it should be appreciated that because the NCF 503 is a film (semisolid), after being pressed only a minimal amount of encapsulant would be expected to flow between the chiplets 505a-505g when they are placed on the film.

Referring to FIG. 5B, subsequent to one or more operations that result in the cross-section shown in FIG. 5A, a gap fill dispense is performed. In an embodiment, the gap fill dispense causes gap fill material 507 to fill the space between the chiplets 505a-505g.

Figure 6A:
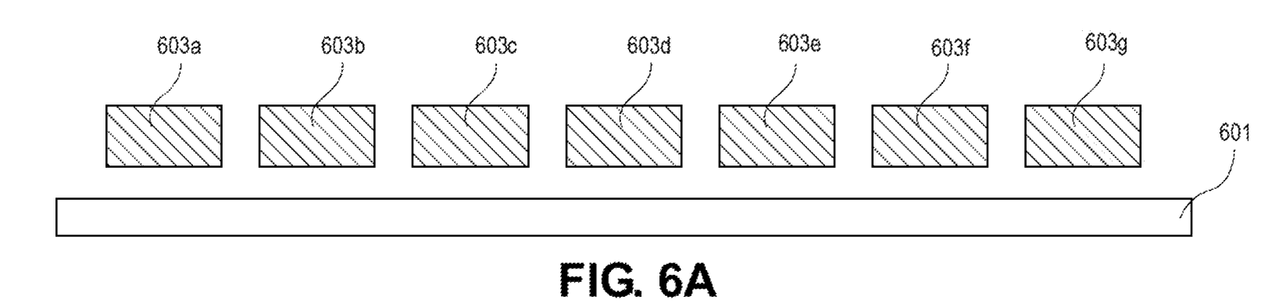
FIGS. 6A-6C illustrate a process for forming a semiconductor die package with different underfill and gap fill materials according to an embodiment.
Figure 6B:
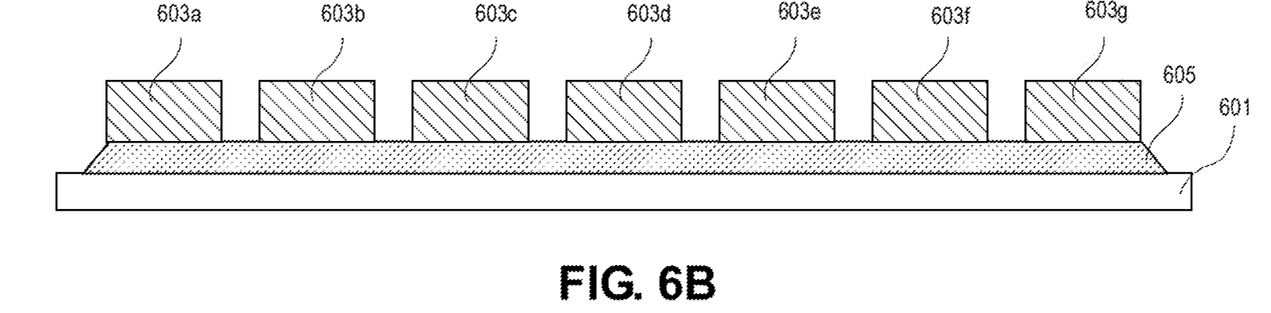
Figure 6C:
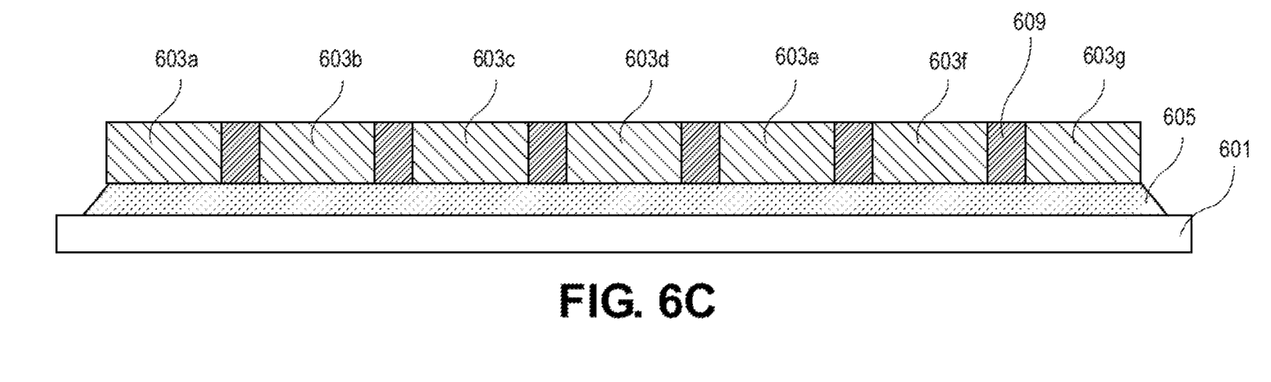

FIGS. 6A-6C illustrate a gap fill assembly process according to an embodiment. Referring to FIG. 6A, the initial structure includes base die 601 and chiplets 603a-603g. In this embodiment, the chiplets 603a-603g are placed above the base die 601 before gap fill material 605 is formed between the chiplets 603a-603g and before underfill material is formed on the base die 601.

Referring to FIG. 6B, subsequent to one or more operations that result in the cross-section shown in FIG. 6A, an underfill 605 dispense is performed. In an embodiment, the amount of underfill 605 that is dispensed is controlled to ensure that the die-to-die space between the chiplets 603a-603g is not filled. Referring to FIG. 6C, subsequent to one or more operations that result in the cross-section shown in FIG. 6B, a gap fill 609 dispense is performed.

Figure 7A:
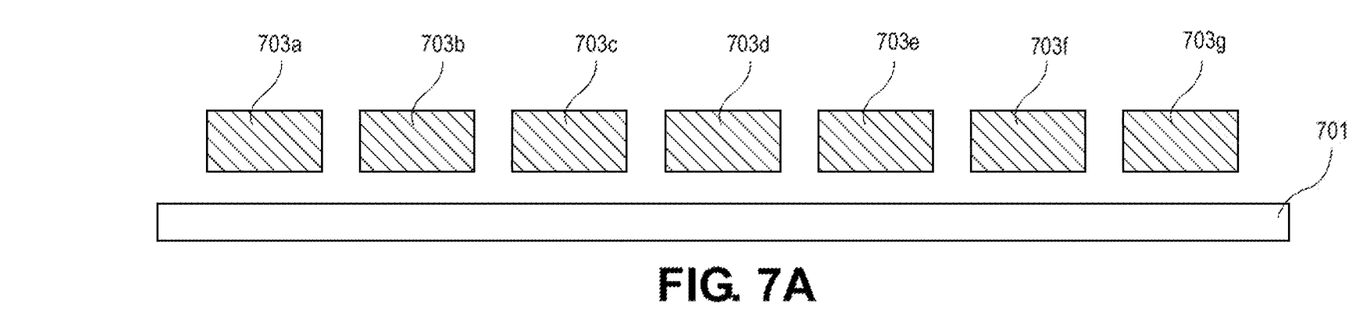
FIGS. 7A-7C illustrate a process for forming a semiconductor die package with different underfill and gap fill materials according to an embodiment.
Figure 7B:
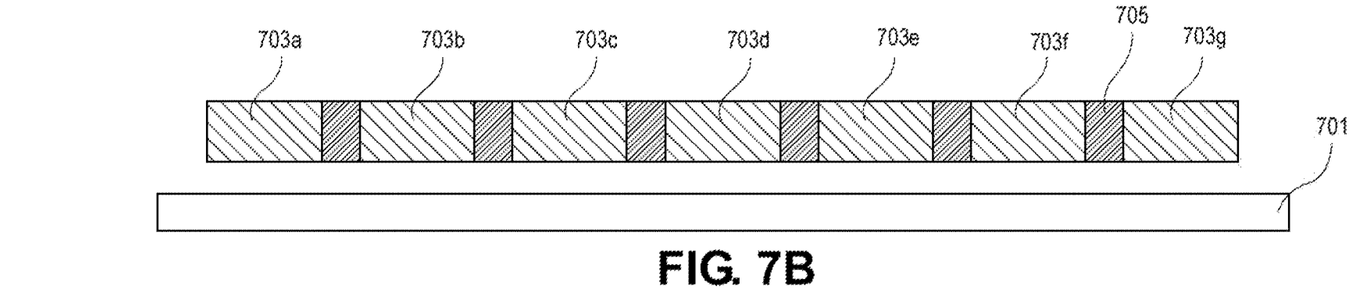
Figure 7C:
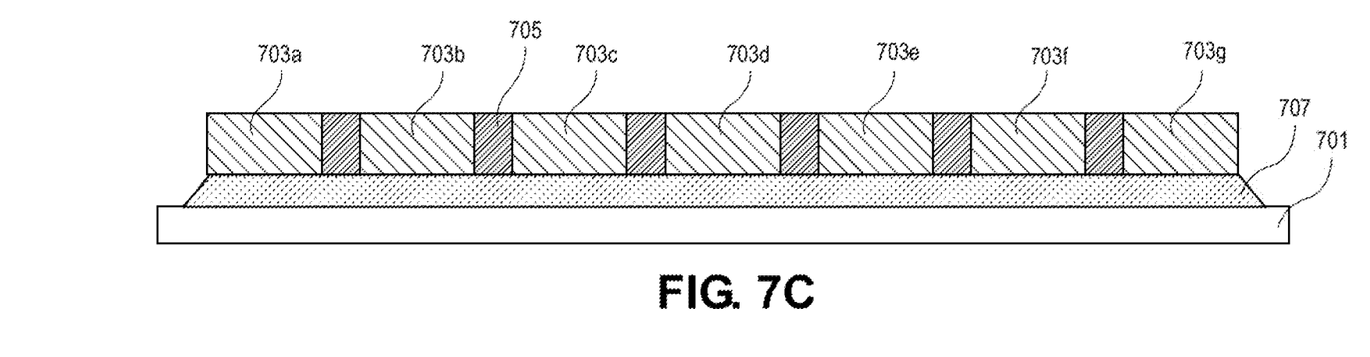

FIGS. 7A-7C illustrate a gap fill assembly process according to an embodiment. Referring to FIG. 7A, the initial structure includes base die 701, and chiplets 703a-703g.

Referring to FIG. 7B, subsequent to one or more operations that result in the cross-section shown in FIG. 7A, a gap fill 705 dispense is performed. In an embodiment, the gap fill 705 material is caused to remain in the space between the chiplets 703a-703g. In an embodiment, the material is caused to remain in the space between the chiplets 703a-703g based on capillary action. In an embodiment, to achieve this, the rheological properties of the gap fill 705 material are chosen to cause the gap fill 705 material to remain in the space between the chiplets 703a-703g.

Referring to FIG. 7C, subsequent to one or more operations that result in the cross-section shown in FIG. 7B, an underfill dispense 707 is performed.

Figure 8:
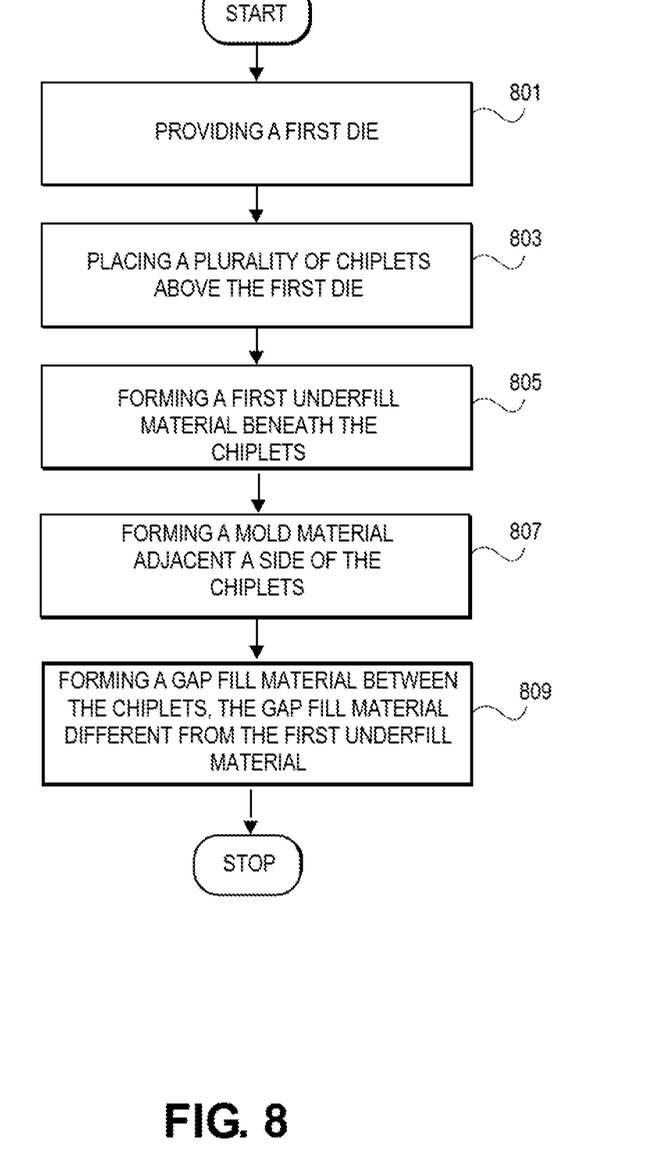
FIG. 8 illustrates a flowchart of a method for forming a semiconductor die package with different underfill and gap fill materials according to an embodiment

FIG. 8 illustrates a flowchart of a method for warpage management according to an embodiment. In an embodiment, the method includes, at 801, providing a first die. At 803, placing a plurality of chiplets above the first die. At 805, forming a first underfill material beneath the chiplets. At 807, forming a mold material adjacent a side of the chiplets. At 809, forming a gap fill material between the chiplets, the gap fill material different from the first underfill material. In an embodiment, an interface region is formed between the first underfill material and the gap fill material.

In an embodiment, the gap fill material is different from the mold material. In an embodiment, the gap fill material has a Tg of less than 80 degrees Celsius. In an embodiment, the gap fill material has a modulus of elasticity that is lower than 6 Gpa. In an embodiment, the gap fill has a percent elongation that is greater than 6 percent. In an embodiment, the method can further include forming a companion die on the underfill material. In addition, in an embodiment, the method can further include forming a thermal interface material above the plurality of chiplets and the companion die, and forming a heat spreader above the thermal interface material and covering the plurality of chiplets and the companion die.

Figure 9:
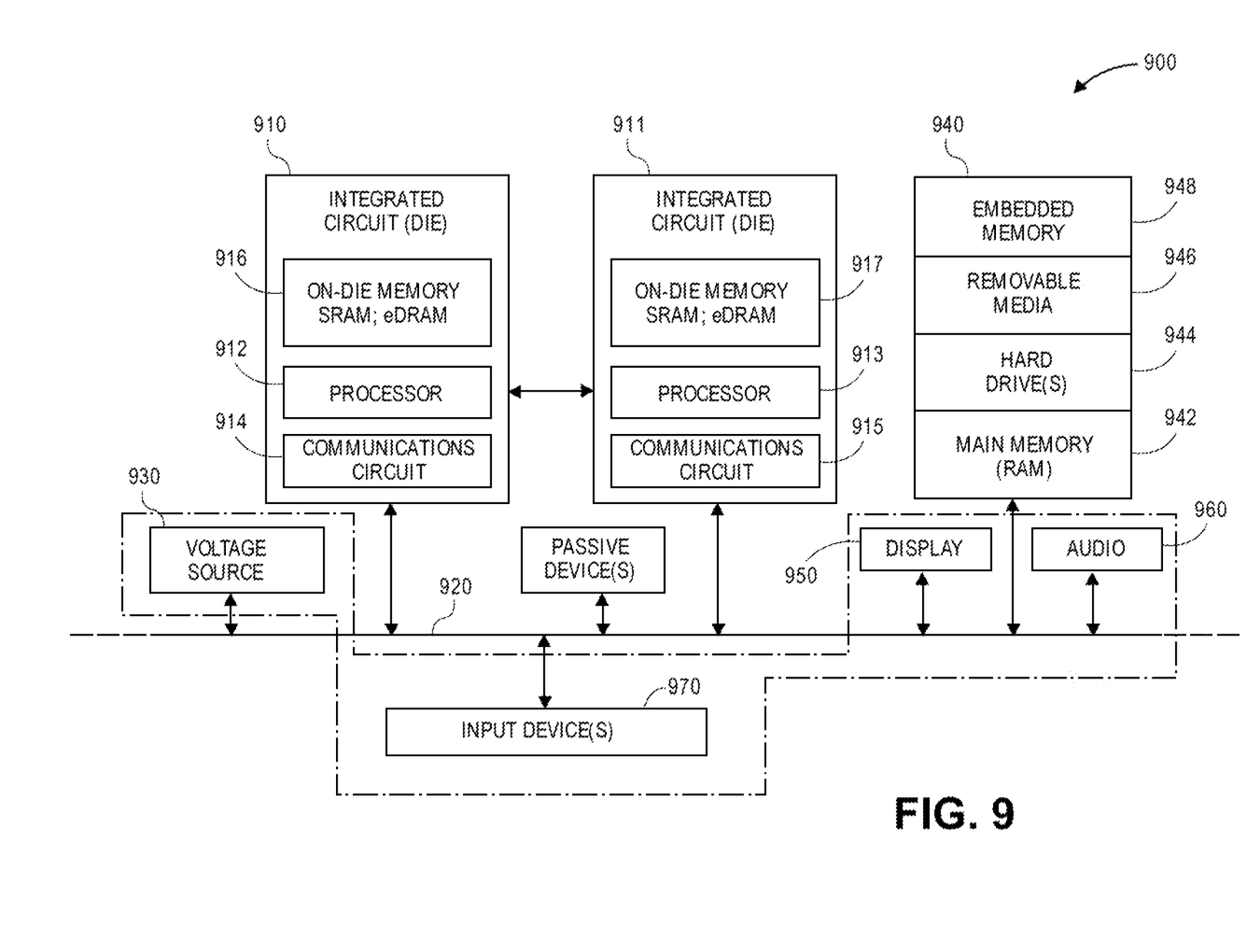
FIG. 9 illustrates a schematic of a computer system in accordance with an embodiment.

FIG. 9 is a schematic of a computer system 900, in accordance with an embodiment of the present invention. The computer system 900 (also referred to as the electronic system 900) as depicted can embody the semiconductor die package 300 of FIG. 3, according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader. The computer system 900 may be a server system. The computer system 900 may be a supercomputer or high-performance computing system.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes, or is coupled with, semiconductor die package 300 of FIG. 3, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950, an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including a package substrate having semiconductor die package 300 of FIG. 3, according to any of the several disclosed embodiments and their equivalents, an electronic system, a computer system, one or more methods of fabricating an integrated circuit, and one or more methods of fabricating an electronic assembly that includes the semiconductor die package 300 of FIG. 3, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates that include the semiconductor die package 300 of FIG. 3 embodiments and their equivalents. A foundation substrate may be included, as represented by the dashed line of FIG. 9. Passive devices may also be included, as is also depicted in FIG. 9.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A device, comprising: a first die; a plurality of chiplets above the first die; a first underfill material beneath the chiplets; a gap fill material between the chiplets, the gap fill material different from the first underfill material; and an interface region between the first underfill material and the gap fill material.

Example Embodiment 2

The device of example embodiment 1, further comprising a mold material adjacent sides of the chiplets, wherein the gap fill material is different from the mold material.

Example Embodiment 3

The device of example embodiment 1 or 2, wherein the gap fill material has a transition temperature of less than 80 degrees Celsius.

Example Embodiment 4

The device of example embodiment 1, 2, or 3, wherein the gap fill material has a modulus of elasticity that is less than 6 Gpa.

Example Embodiment 5

The device of example embodiment 1, 2, 3, or 4, wherein the gap fill has a percent elongation that is greater than 6 percent.

Example Embodiment 6

The device of example embodiment 1, 2, 3, 4, or 5, further including a second die on a second underfill material.

Example Embodiment 7

The device of example embodiment 6, further comprising a thermal interface material above the plurality of chiplets and the second die; and a heat spreader above the thermal interface material and covering the plurality of chiplets and the second die.

Example Embodiment 8

A system, comprising: one or more processing components; and one or more data storage components, at least one of the processing components and the data storage components including at least one semiconductor device, the at least one semiconductor device including: a first die; a plurality of chiplets above the first die; a first underfill material beneath the chiplets; a gap fill material between the chiplets, the gap fill material different from the first underfill material; and an interface region between the first underfill material and the gap fill material.

Example Embodiment 9

The system of example embodiment 8, further comprising a mold material adjacent sides of the chiplets, wherein the gap fill material is different from the mold material.

Example Embodiment 10

The system of example embodiment 8 or 9, wherein the gap fill material has a transition temperature of less than 80 degrees Celsius.

Example Embodiment 11

The system of example embodiment 8, 9 or 10, wherein the gap fill material has a modulus of elasticity that is less than 6 Gpa.

Example Embodiment 12

The system of example embodiment 8, 9, 10, or 11, wherein the gap fill has a percent elongation that is greater than 6 percent.

Example Embodiment 13

The system of example embodiment 8, 9, 10, 11, or 12, further including a second die on a second underfill material.

Example Embodiment 14

The system of example embodiment 13, further comprising a thermal interface material above the plurality of chiplets and the second die; and a heat spreader above the thermal interface material and covering the plurality of chiplets and the second die.

Example Embodiment 15

A method, comprising: placing a plurality of chiplets above a wafer; placing an underfill material underneath the plurality of chiplets; and placing a gap fill material between the plurality of chiplets, the gap fill material different from the underfill material, wherein an interface region is formed between the underfill material and the gap fill material.

Example Embodiment 16

The method of claim 15, wherein the underfill material is placed on the wafer before the chiplets are placed above the wafer.

Example Embodiment 17

The method of example embodiment 15, wherein the underfill material is placed on the wafer after the chiplets are placed above the wafer.

Example Embodiment 18

The method of example embodiment 15, wherein the gap fill material is formed between the plurality of chiplets before the underfill material is placed underneath the plurality of chiplets.

Example Embodiment 19

The method of example embodiment 15, 16, 17, or 18, wherein the gap fill material has a transition temperature of less than 80 degrees Celsius.

Example Embodiment 20

The method of example embodiment 15, 16, 17, 18, or 19, wherein the gap fill material has a modulus of elasticity that is less than 6 Gpa.

Example Embodiment 21

The method of example embodiment 15, 16, 17, 18, 19, or 20, wherein the gap fill has a percent elongation that is greater than 6 percent.

Example Embodiment 22

A method, comprising: forming a first die; forming a plurality of chiplets above the first die; forming a first underfill material beneath the chiplets; and forming a gap fill material between the chiplets, the gap fill material different from the first underfill material, wherein an interface region is formed between the first underfill material and the gap fill material.

Example Embodiment 23

The method of example embodiment 22, further comprising forming a mold material adjacent sides of the chiplets, wherein the gap fill material is different from the mold material.

Example Embodiment 24

The method of example embodiment 22, or 23, wherein the gap fill material has a transition temperature of less than 80 degrees Celsius.

Example Embodiment 25

The method of example embodiment 22, 23, or 24, wherein the gap fill material has a modulus of elasticity that is less than 6 Gpa.

Example Embodiment 26

The method of example embodiment 22, 23, 24, or 25, wherein the gap fill has a percent elongation that is greater than 6 percent.

Example Embodiment 27

The method of example embodiment 22, 23, 24, 25, or 26, further comprising forming a second die on a second underfill material.

Example Embodiment 28

The method of example embodiment 27, further comprising forming a thermal interface material above the plurality of chiplets and the second die; and forming a heat spreader above the thermal interface material and covering the plurality of chiplets and the second die.

What is claimed is:
1. A device, comprising:
a first die;
a plurality of chiplets above the first die;
a first underfill material beneath the chiplets;
a gap fill material between the chiplets, the gap fill material different from the first underfill material;
an interface region between the first underfill material and the gap fill material; and
a mold material adjacent sides of the chiplets, wherein the gap fill material is different from the mold material.
2. The device of claim 1, wherein the gap fill material has a transition temperature of less than 80 degrees Celsius.
3. The device of claim 1, wherein the gap fill material has a modulus of elasticity that is lower than 6 Gpa.
4. The device of claim 1, wherein the gap fill has a percent elongation that is greater than 6 percent.
5. The device of claim 1, further including a second die on a second underfill material.
6. The device of claim 5, further comprising a thermal interface material above the plurality of chiplets and the second die; and a heat spreader above the thermal interface material and covering the plurality of chiplets and the second die.
7. A system, comprising:
one or more processing components; and
one or more data storage components, at least one of the processing components and the data storage components including at least one semiconductor device, the at least one semiconductor device including:
a first die;
a plurality of chiplets above the first die;
a first underfill material beneath the chiplets;
a mold material adjacent a side of the chiplets; and
a gap fill material between the chiplets, the gap fill material different from the first underfill material; and an interface region between the first underfill material and the gap fill material.

8. The system of claim 7, further comprising a mold material adjacent sides of the chiplets, wherein the gap fill material is different from the mold material.

9. The system of claim 7, wherein the gap fill material has a transition temperature of less than 80 degrees Celsius.

10. The system of claim 7, wherein the gap fill material has a modulus of elasticity that is less than 6 Gpa.

11. The system of claim 7, wherein the gap fill has a percent elongation that is greater than 6 percent.

12. The system of claim 7, further including a second die on a second underfill material.

13. The system of claim 12, further comprising a thermal interface material above the plurality of chiplets and the second die; and a heat spreader above the thermal interface material and covering the plurality of chiplets and the second die.

14. A method, comprising:
placing a plurality of chiplets above a wafer;
placing an underfill material underneath the plurality of chiplets; and
placing a gap fill material between the plurality of chiplets, the gap fill material different from the underfill material, wherein an interface region is formed between the underfill material and the gap fill material, wherein the gap fill material is formed between the plurality of chiplets before the underfill material is placed underneath the plurality of chiplets.

15. The method of claim 14, wherein the underfill material is placed on the wafer before the chiplets are placed above the wafer.

16. The method of claim 14, wherein the underfill material is placed on the wafer after the chiplets are placed above the wafer.

17. The method of claim 14, wherein the gap fill material has a transition temperature of less than 80 degrees Celsius.

18. The method of claim 14, wherein the gap fill material has a modulus of elasticity that is less than 6 Gpa.

19. The method of claim 14, wherein the gap fill has a percent elongation that is greater than 6 percent.

20. A method, comprising:
providing a first die;
placing a plurality of chiplets above the first die;
forming a first underfill material beneath the chiplets;
forming a gap fill material between the chiplets, the gap fill material different from the first underfill material, wherein an interface region is formed between the first underfill material and the gap fill material; and
forming a mold material adjacent the sides of the chiplets wherein the gap fill material is different from the mold material.

21. The method of claim 20, wherein the gap fill material has a transition temperature of less than 80 degrees Celsius.

22. The method of claim 20, wherein the gap fill material has a modulus of elasticity that is less than 6 Gpa.

23. A device, comprising:
a first die;
a plurality of chiplets above the first die;
a first underfill material beneath the chiplets;
a gap fill material between the chiplets, the gap fill material different from the first underfill material, wherein the gap fill material has a transition temperature of less than 80 degrees Celsius; and
an interface region between the first underfill material and the gap fill material.

24. A device, comprising:
a first die;
a plurality of chiplets above the first die;
a first underfill material beneath the chiplets;
a gap fill material between the chiplets, the gap fill material different from the first underfill material, wherein the gap fill material has a modulus of elasticity that is lower than 6 Gpa; and
an interface region between the first underfill material and the gap fill material.

25. A device, comprising:
a first die;
a plurality of chiplets above the first die;
a first underfill material beneath the chiplets;
a gap fill material between the chiplets, the gap fill material different from the first underfill material, wherein the gap fill has a percent elongation that is greater than 6 percent; and
an interface region between the first underfill material and the gap fill material.

26. A device, comprising:
a first die;
a plurality of chiplets above the first die;
a first underfill material beneath the chiplets;
a gap fill material between the chiplets, the gap fill material different from the first underfill material;
an interface region between the first underfill material and the gap fill material; and
a second die on a second underfill material.

* * * * *